(12) United States Patent
Menzel (10) Patent No.: US 10,256,924 B1
(45) Date of Patent: Apr. 9, 2019

(54) MEASURING DEVICE AND MEASURING METHOD FOR NOISE-CORRECTED TRANSMITTER PERFORMANCE MEASUREMENT

(71) Applicant: Rohde & Schwarz GmbH & Co. KG, Munich (DE)

(72) Inventor: Edwin Menzel, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 15/955,443

(22) Filed: Apr. 17, 2018

(30) Foreign Application Priority Data

Nov. 16, 2017 (EP) ..................................... 17201989

(51) Int. Cl.
*H04B 17/15* (2015.01)
(52) U.S. Cl.
CPC ..................................... *H04B 17/15* (2015.01)
(58) Field of Classification Search
None
See application file for complete search history.

(56) References Cited

U.S. PATENT DOCUMENTS

| | | | | |
|---|---|---|---|---|
| 5,937,006 | A * | 8/1999 | Clark | G01R 27/32 324/601 |
| 2007/0225927 | A1 * | 9/2007 | Bessho | G01R 29/26 702/72 |
| 2009/0046791 | A1 * | 2/2009 | Hamaguchi | H04L 1/0072 375/260 |
| 2010/0128124 | A1 * | 5/2010 | Cho | G01R 29/10 348/143 |
| 2011/0229128 | A1 * | 9/2011 | Sakamoto | H04B 10/0775 398/29 |
| 2013/0023283 | A1 * | 1/2013 | Chakravarty | G01S 5/0252 455/456.1 |
| 2015/0055729 | A1 * | 2/2015 | Karabinis | H03F 3/24 375/295 |
| 2016/0006557 | A1 * | 1/2016 | Shirakawa | H04L 27/22 375/362 |
| 2018/0212658 | A1 * | 7/2018 | Miao | H04B 7/0617 |

* cited by examiner

*Primary Examiner* — Lana N Le
(74) *Attorney, Agent, or Firm* — Potomac Technology Law, LLC (57) ABSTRACT

A measuring device for transmitter performance measuring is provided. The measuring device includes a first measuring path adapted to receive a measuring signal from a device under test, and to determine first measuring values from the measuring signal. The measuring device further includes a second measuring path adapted to receive the measuring signal, and to determine second measuring values from the measuring signal. The measuring device further includes a noise suppressor, connected to an output of the first measuring path and to an output of the second measuring path, wherein the noise suppressor is adapted to receive the first measuring values and the second measuring values, and to suppress noise by multiplying each of the first measuring values with a respective one of the second measuring values to generate a respective measuring value product.

14 Claims, 7 Drawing Sheets

MEASURING DEVICE AND MEASURING METHOD FOR NOISE-CORRECTED TRANSMITTER PERFORMANCE MEASUREMENT

RELATED APPLICATION(S)

The present application claims priority from European Patent Application No. EP17201989.5 (filed 2017 Nov. 16), the entirety of which are incorporated herein by reference.

TECHNICAL FIELD

The present invention relates to a measuring method and a measuring device for measuring the performance of a transmitter.

BACKGROUND

For 5G equipment performance tests, very low noise levels of the equipment to be tested need to be measured. When measuring such low noise levels, the noise generated by a transmission channel from the device under test to the measuring device as well as the noise generated by the measuring device itself are significant factors. Eliminating these sources of noise by conventional means requires significant hardware effort.

Alternative methods for eliminating noise, like using a correlation of two signals are known for example from the document US20070225927A1. Performing such a correlation though, also results in a high hardware effort.

What is needed, therefore, is a measuring device and a measuring method that facilitate elimination of channel noise and measuring device noise, while requiring only a low hardware complexity.

SOME EXAMPLE EMBODIMENTS

Embodiments of the present invention advantageously address the foregoing requirements and needs, as well as others, by providing a measuring device and a measuring method that facilitate elimination of channel noise and measuring device noise, while requiring only a low hardware complexity.

According to example embodiments, a measuring device for transmitter performance measurement comprises a first measuring path adapted to receive a measuring signal from a device under test and determine first measuring values from the measuring signal. The measuring device further comprises a second measuring path adapted to receive the measuring signal and determine second measuring values from the measuring signal. The measuring device further comprises a noise suppressor, which is connected to an output of the first measuring path and to an output of the second measuring path, and is adapted to receive the first measuring values and the second measuring values and suppress noise, by, for each first measuring value, multiplying the first measuring value with a second measuring value, thereby generating a plurality of measuring value products. The noise generated by the channel and the measuring device thereby equals out over time.

When measuring the measuring signal, it is not necessary to measure the entire measuring signal by each measuring path. Also a measuring of only a part of the measuring signal is possible. Even a measuring of different parts of the measuring signal by the first measuring path and the second measuring path is possible.

According to a further embodiment, the noise suppressor is adapted to determine a performance signal of the device under test based upon the plurality of measuring value products. By way of example, the performance value signal is an error vector magnitude or an in-band emission. It is thereby possible to very accurately determine the quality of the device under test requiring only a low hardware complexity.

According to a further example embodiment, the noise suppressor is adapted to sum up the plurality of measuring value products, normalize the summed up plurality of measuring value products by a number of measuring value products of the plurality of measuring value products and/or a base power level, thereby generating a normalized sum of products. The noise suppressor may be further adapted to determine the performance value based upon the normalized sum of products. This allows for a very simple but accurate determining of the quality of the device under test.

According to a further example embodiment, the first measuring path comprises a first antenna or a first connector for receiving the measuring signal, and the second measuring path comprises a second antenna or a second connector for receiving the measuring signal. This allows for performing an over the air measurement or a wire-bound measurement without incurring a high hardware effort.

According to a further example embodiment, the measuring device comprises a third antenna or a third connector for receiving the measuring signal, and a splitter adapted to split the received measuring signal between the first measuring path and the second measuring path. This allows for an even simpler setup.

According to a further example embodiment, the first measuring path and the second measuring path each comprise a radio frequency corrector adapted to determine and/or correct a carrier frequency error and/or a carrier frequency leakage. This further increases the accuracy.

According to a further example embodiment, the first measuring path and the second measuring path each comprise a fast Fourier transformer adapted to transform the measuring signal or a signal derived from the measuring signal into the frequency domain. This allows for an analysis on the frequency domain.

According to a further example embodiment, the first measuring path and the second measuring path each comprise an inverse discrete Fourier transformer adapted to transform a frequency domain signal, derived from the measuring signal, into the time domain. This allows for reverting the resulting performance value signal into the time domain.

According to a further example embodiment, the first measuring path and/or the second measuring path comprise an equalizer adapted to perform a signal level equalization of the first measuring path and the second measuring path. This further increases the accuracy.

According to a further example embodiment, the measuring signal comprises vertically polarized components and horizontally polarized components. By differentiating between the polarization directions, an increase of accuracy can be achieved.

According to a further example embodiment, the first measuring path comprises a vertical sub-path adapted to receive the vertically polarized components of the measuring signal and generate first vertical sub measuring values therefrom. The first measuring path further comprises a horizontal sub-path adapted to receive the horizontally polarized components of the measuring signal and generate first horizontal sub measuring values therefrom. The second measuring path comprises a vertical sub-path adapted to receive the vertically polarized components of the measuring signal and to generate second vertical sub measuring values therefrom. The second measuring path further comprises a horizontal sub-path adapted to receive the horizontally polarized components of the measuring signal and generate second horizontal sub measuring values therefrom. The first measuring path further comprises a first maximum ratio combiner adapted to combine the first vertical sub measuring values and the first horizontal sub measuring values, resulting in the first measuring values. The second measuring path further comprises a second maximum ratio combiner adapted to combine the second vertical sub measuring values and the second horizontal sub measuring values, resulting in the second measuring values. By processing the different polarization directions in this manner, the accuracy can further be increased.

According to a further example embodiment, in a first step, the first measuring path is adapted to receive the vertically polarized components of the measuring signal and generate first vertical sub measuring values therefrom, and the second measuring path is adapted to receive the vertically polarized components of the measuring signal and generate second vertical sub measuring values therefrom. In a second step, the first measuring path is adapted to receive the horizontally polarized components of the measuring signal and generate first horizontal sub measuring values therefrom, and the second measuring path is adapted to receive the horizontally polarized components of the measuring signal and generate second horizontal sub measuring values therefrom. The measuring device comprises a maximum ratio combiner adapted to combine the first horizontal measuring values with the first vertical sub measuring values and generate the first measuring signal therefrom, and to combine the second horizontal sub measuring values with the second vertical sub measuring values and generate the second measuring signal therefrom. By this successive approach, the hardware effort can be significantly reduced, while at the same time increasing the measuring time.

According to a further example embodiment, the measuring device comprises a further fast Fourier transformer adapted to transform the performance signal into the frequency domain. This allows for an analysis of the performance of the device under test in the frequency domain.

According to a further example embodiment, the first measuring path comprises a first in-phase sub-path adapted to receive an in-phase component of the measuring signal, resulting in first in-phase measuring values. The first measuring path further comprises a first quadrature sub-path adapted to receive a quadrature component of the measuring signal, resulting in first quadrature measuring values. The second measuring path comprises a second in-phase sub-path adapted to receive the in-phase component of the measuring signal, resulting in second in-phase measuring values. The second measuring path further comprises a second quadrature sub-path adapted to receive the quadrature component of the measuring signal, resulting in second quadrature measuring values. The measuring device further comprises a first further maximum ratio combiner adapted to combine the first in-phase measuring values with the first quadrature measuring values and generate the first measuring signal therefrom. The measuring device further comprises a second further maximum ratio combiner adapted to combine the second in-phase measuring values with the second quadrature measuring values and generate the second measuring signal therefrom. By differentiating between the in-phase component and the quadrature component of the measuring signal, a further increase of accuracy can be achieved.

According to further example embodiments, a measuring method is provided for transmitter performance measuring. The method comprises receiving a measuring signal, from a device under test, via first measuring path, and determining first measuring values from the measuring signal. The method further comprises receiving the measuring signal, via a second measuring path, and determining second measuring values from the measuring signal. The method further comprises receiving the first measuring values and the second measuring values and generating a plurality of measuring value products by, for each first measuring value, multiplying the first measuring value with a respective second measuring value. The method further comprises determining a performance signal of the device under test based on the plurality of measuring value products. The noise generated by the channel and the measuring device therefore equals out overtime.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Embodiments of the present invention are illustrated by way of example, and not by way of limitation, in the figures of the accompanying drawings, in which like reference numerals refer to similar elements, and in which.

DETAILED DESCRIPTION

A measuring device and a measuring method that facilitate elimination of channel noise and measuring device noise, while requiring only a low hardware complexity, are described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

As will be appreciated, a processor, unit, module or component (as referred to herein) may be composed of software component(s), which are stored in a memory or other computer-readable storage medium, and executed by one or more processors or CPUs of the respective devices. As will also be appreciated, however, a module or unit may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in a computer memory store.

Figure 1:
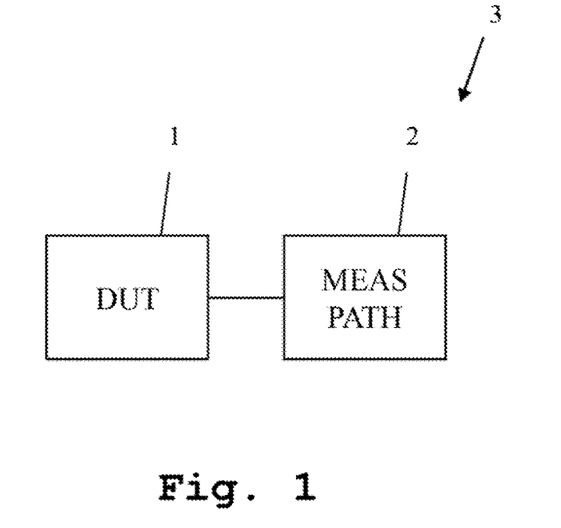
FIG. 1 shows an example prior art measuring device.

First, the function and disadvantages of a prior art measuring device are described with regard to FIG. 1. With regard to FIGS. 2-7, different example measuring devices according to embodiments of the present invention are shown and described in detail. Then, with regard to FIG. 8, an example measuring method according to embodiments of the present invention is described in detail. Similar entities and reference numbers in different figures have been partially omitted.

FIG. 1 shows an example prior art measuring device 3. The device comprises only a single measuring path 2, which is connected to a device under test 1. The measuring device records samples Y, which result from actual emissions $Y_{DUT}$ by the device under test (DUT), noise generated by the channel $Y_{Channel}$, and noise generated by the test equipment $Y_{TE}$, according to the following formula:

$$Y = Y_{DUT} + Y_{Channel} + Y_{TE} = Y_{DUT} + Y_{Ch,TE}$$

It can clearly be seen that, especially for low power levels of the signal emitted by the device under test 1, the noise generated by the channel and the test equipment can prevent an accurate measurement.

Even when normalizing over time according to the following formula, one cannot alleviate this issue, since the noise generated by the channel and the test equipment cannot be removed:

$$\frac{1}{N}\sum_{k=1}^{N}|Y_1^{(k)}|^2$$

Figure 2:
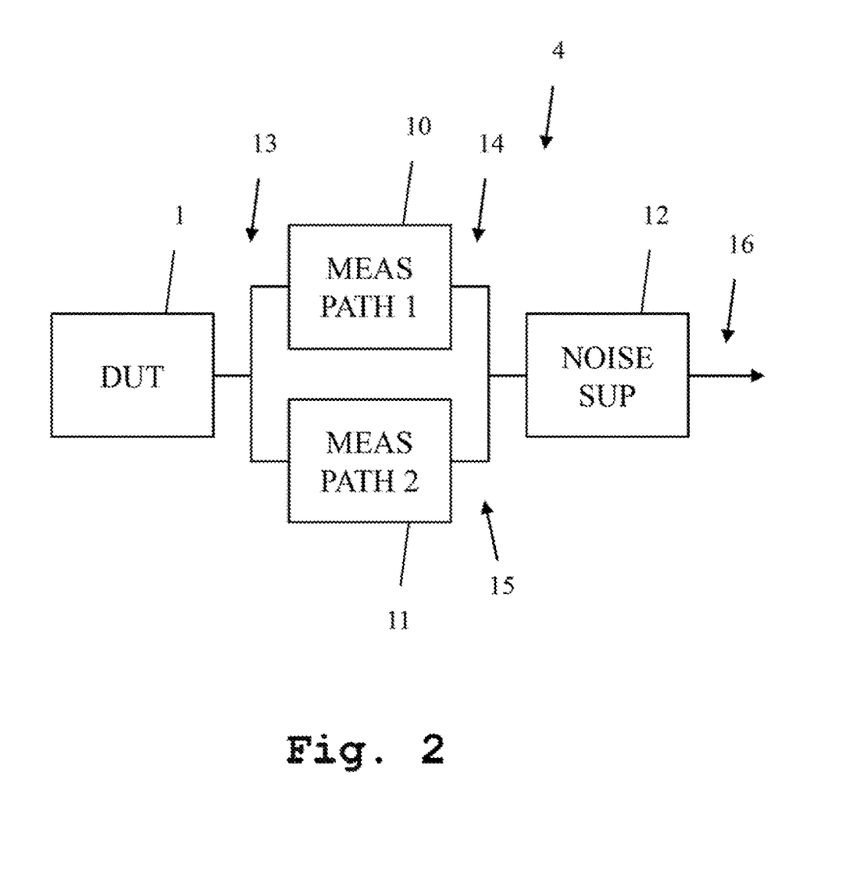
FIG. 2 shows an example measuring device, in accordance with example embodiments of the present invention.

FIG. 2 shows an example measuring device 4, in accordance with example embodiments of the present invention. The measuring device 4 comprises a first measuring path 10 and a second measuring path 11, which are both connected to a noise suppressor 12. A device under test 1 generates a measuring signal 13 and supplies it to the first measuring path 10 and the second measuring path 11. The measuring paths 10, 11 each measure the measuring signal 13 independently, and generate first measuring values 14 and second measuring values 15. These are handed on to the noise suppressor 12, which generates a performance value signal 16 therefrom.

The noise suppressor 16 multiplies each of the first measuring values 14 with a respective second measuring value 15, and sums up these products before normalizing the sum with the number of measuring signals and a base power level P. Each first measuring value and the respective second measuring value belong to the same point in time. After calculating a square route, the resulting performance value 16 has been determined. This can be seen in the following formula:

$$X_{meas} = \sqrt{\frac{1}{NP_0}\sum_{k=1}^{N} Y_1^{(k)} \cdot \left(Y_2^{(k)}\right)^*} = X_{DUT}$$

Wherein $Y_1^{(k)}$ is the $k^{th}$ sample of the first measuring value, $Y_2^{(k)}$ is the $k^{th}$ sample of the second measuring value, where k is the number of the presently processed samples, $P_0$ is the base power level, and N is the total number of processed samples, and where ( )* denotes the complex conjugate of the value inside the brackets.

The foregoing formula is defined for values of $Y_1$ and $Y_2$, which do not comprise an imaginary part. Formulas, which are also defined for values of $Y_1$ and $Y_2$, which comprise an imaginary part, are defined with regard to FIG. 7.

The above formula is applicable to many different cases. For example, in-band emissions or an error vector magnitude can be determined by this method.

Figure 3:
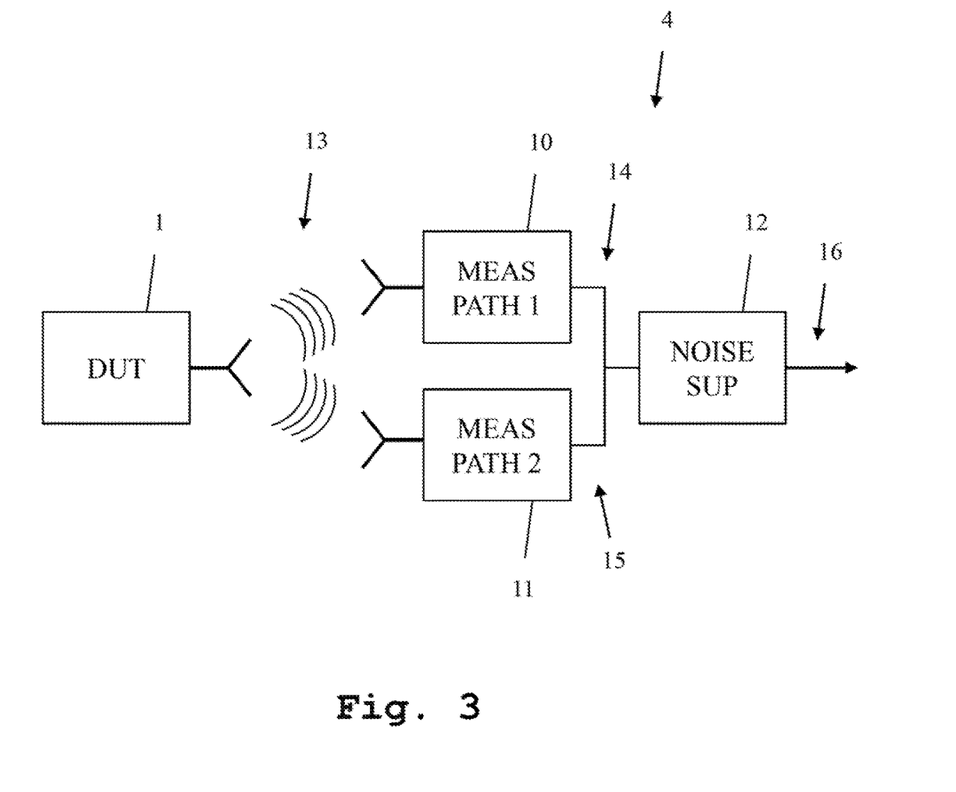
FIG. 3 shows a further example measuring device, in accordance with example embodiments of the present invention.

In the embodiment shown in FIG. 2, the device under test 1 is connected to the measuring paths 10, 11 by a wire-bound connection. In this case, the measuring device comprises a connector for a respective cable. FIG. 3 shows an alternate example measuring device, in accordance with example embodiments of the present invention, which uses an over the air measurement. In FIG. 3, the device under test 1 comprises an antenna, while also each measuring path 10, 11 comprises an antenna for receiving the measuring signal 13.

Figure 4:
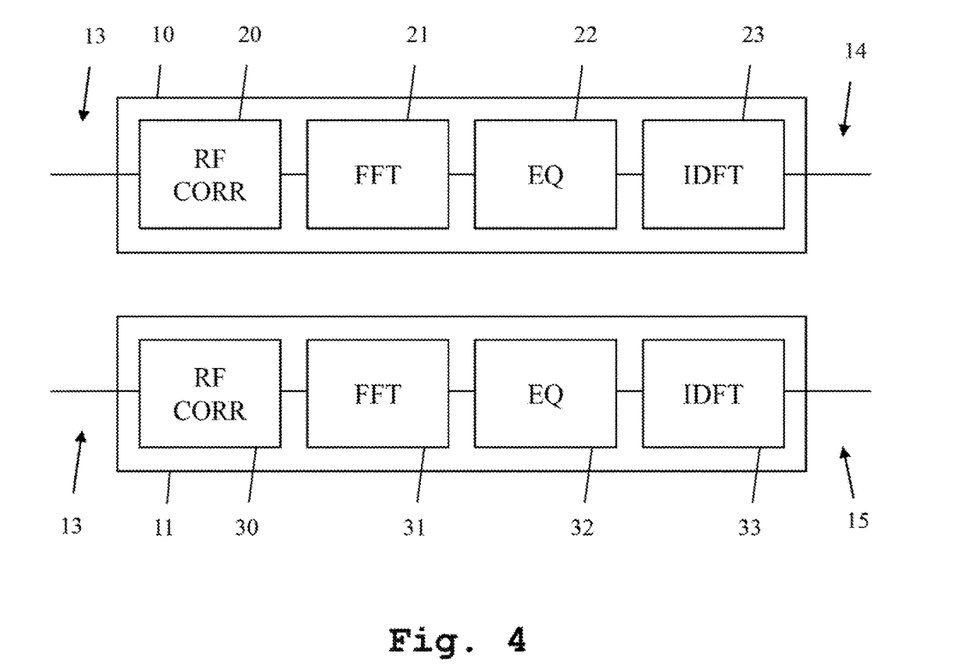
FIG. 4 shows example measuring paths of a measuring device, in accordance with example embodiments of the present invention.

FIG. 4 shows example measuring paths of a measuring device, in accordance with example embodiments of the present invention, wherein the detailed construction of the measuring paths 10, 11 is shown. In the embodiment of FIG. 4, each measuring path 10, 11 comprises a radio frequency corrector 20, which is connected to the device under test and supplied with the measuring signal 13. The radio frequency correctors 20, 30 determine and/or correct a carrier frequency error and/or a carrier frequency leakage.

As shown in the embodiment of FIG. 4, the measuring paths 10, 11 each further comprises a fast Fourier transformer 21, 31, connected to the respective radio frequency corrector 20, 30, which transforms the signal into the frequency domain. In this embodiment, the measuring paths 10, 11 each further comprises an equalizer 22, 32, connected to the fast Fourier transformers 21, 31. The equalizers perform a power level equalization of the signals on the two measuring paths 10, 11.

As further shown in the embodiment of FIG. 4, the measuring paths 10, 11 also comprise an inverse discrete Fourier transformer 23, 33, which transform the equalized signal back into the time domain. The output signals of the inverse discrete Fourier transformers 23, 33 form the first measuring values 14 and the second measuring values 15, respectively.

With regard to the embodiment shown in FIG. 4, however, not all of the components shown in the are necessary, and can be individually used or not used as part of the measuring paths 10, 11.

Figure 5:
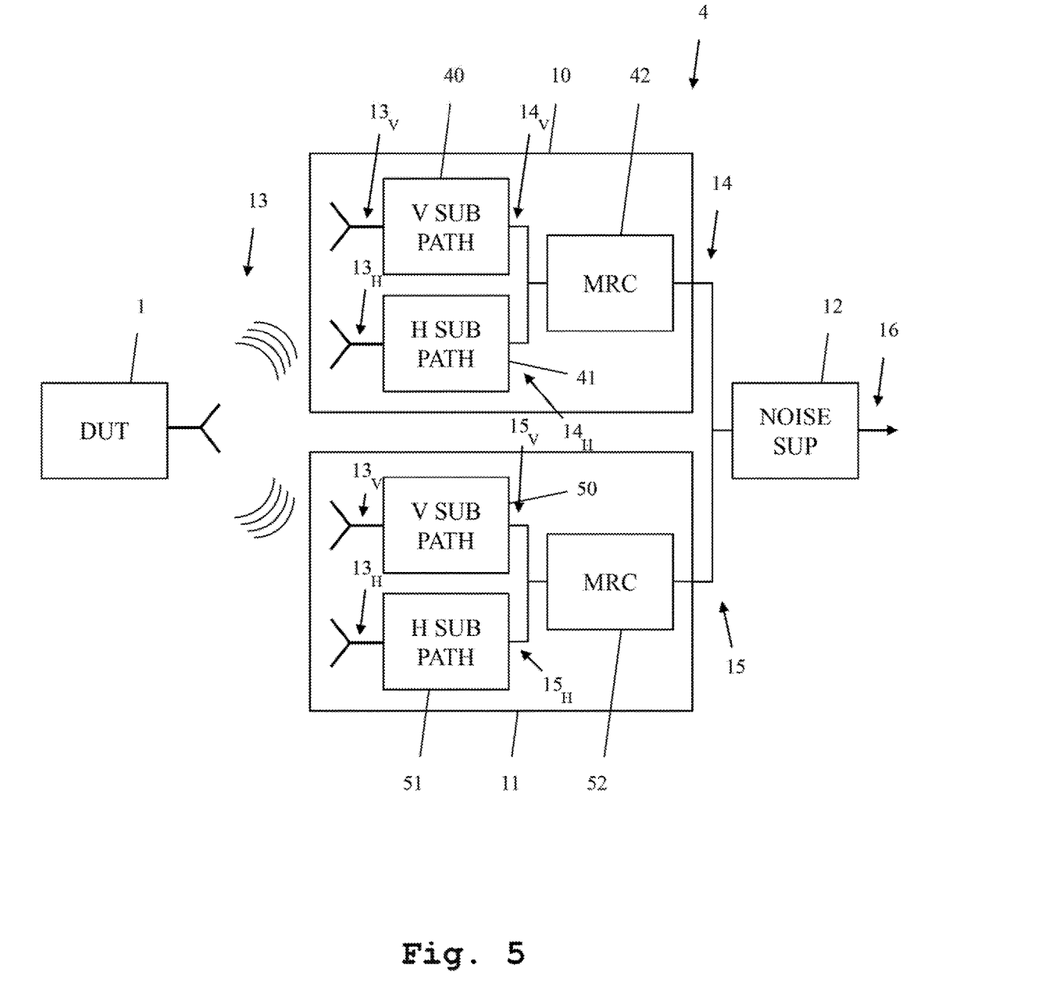
FIG. 5 shows a further example measuring device, in accordance with example embodiments of the present invention.

FIG. 5 shows a further example embodiment of the measuring device 4. In the embodiment of FIG. 5, polarization is used to increase the measuring accuracy. As shown in the figure, each measuring path 10, 11 may comprise a vertical sub-path 40, 50 and a horizontal sub-path 41, 51. The vertical sub-paths 40, 50 each comprises a vertically polarized antenna, and thereby receive a vertically polarized component of the measuring signal $13_V$. The horizontal sub-paths 41, 51 each comprises a horizontally polarized antenna, and thereby receive a horizontally polarized component of the measuring signal $13_H$. Each of the sub-paths 40, 41, 50, 51 are constructed such as any of the measuring paths 10, 11, as shown in FIGS. 2-4. Resulting measuring values $14_V$ of the vertical sub-path 40 and resulting measuring values $14_h$ of the horizontal sub-path 41 are provided to a maximum ratio combiner 42, which combines them to the first measuring values 14.

Resulting measuring values $15_V$ of the measuring sub-path 50 and resulting measuring values $15_H$ of the horizontal sub-path 51 are handed on to a further maximum ratio combiner 52 and combined to the second measuring values 15.

Instead of using separate sub-paths within the first measuring path the second measuring path, alternatively, a single hardware set up can be used successively. In this case, in a first step, the first measuring path and the second measuring path both measure horizontally polarized components of the measuring signal. In a second step, both measuring paths measure vertically polarized components of the measuring signal. Finally, by use of only a single maximum ratio combiner, the respective horizontally polarized measuring values and vertically polarized measuring values are combined, before being provided to the noise suppressor 12 as first measuring signal 14 and second measuring signal 15.

Also, instead of handling both the horizontally polarized components and the vertically polarized components of the measuring signal in both measuring paths, it is possible to handle only one polarization direction in each measuring path. The first measuring path 10 then would comprise two sub-paths, which both handle, for example, the horizontal polarization, while the second measuring path 11 would then comprise two sub-paths, which both handle the vertical polarization.

Also, it is possible to have sub-paths, as shown in FIG. 5, only in one of the measuring paths.

Figure 6:
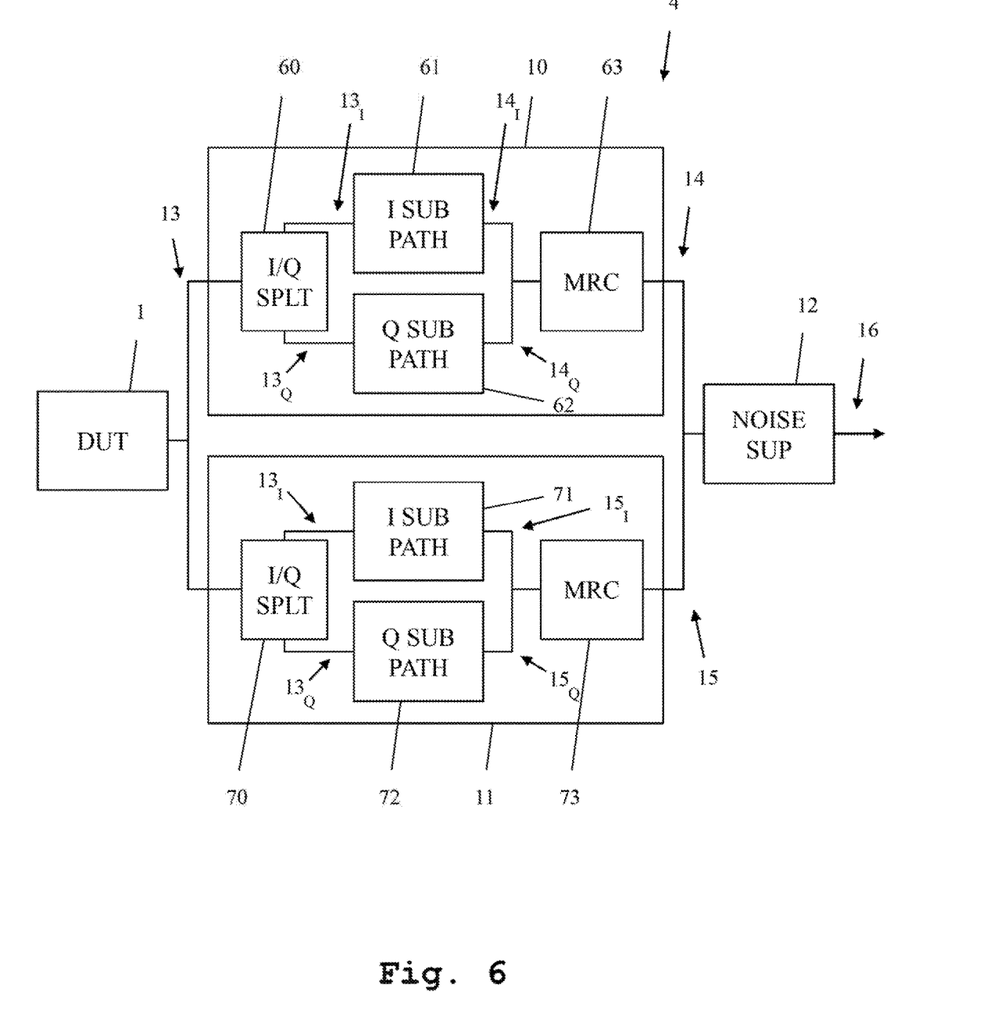
FIG. 6 shows a further example measuring device, in accordance with example embodiments of the present invention.

FIG. 6 shows a further example measuring device 4, which increases accuracy by differentiating between an in-phase component and a quadrature component. The measuring paths 10, 11 here each comprises an in-phase sub-path 61, 71 and a quadrature sub-path 62, 72. Further, each of the measuring paths 10, 11 also comprises a I/Q splitter 60, 70, which generates an in-phase component measuring signal $13_I$ and a quadrature component measuring signal $13_Q$.

Alternatively, only a single I/Q splitter could be provided between the device under test 1 and the measuring paths 10, 11. By way of example, the I/Q splitters 60, 70 can be implemented as I/Q mixers, in practice.

Each of the in-phase sub-paths 61, 71 and quadrature sub-paths 62, 72 may be implemented in the measuring paths 10, 11 of FIGS. 1-4.

According to this embodiment, the device under test 1 provides a measuring signal 13 to the I/Q splitters 60, 70, which generate an in-phase component signal $13_I$ and a quadrature component measuring signal $13_Q$ therefrom. The in-phase component measuring signals $13_I$ are provided to the in-phase sub-paths 61, 71, which perform measurements therefrom and generate in-phase measuring values $14_I$, $15_I$. The quadrature component measuring signals $13_Q$ are provided to the quadrature sub-paths 62, 72, which perform measurements therefrom and generate quadrature measuring values $14_Q$, $15_Q$. Within each of the measuring paths 10, 11, the in-phase measuring values $14_I$, $15_I$ and the quadrature measuring values $14_Q$, $15Q$ are combined by a maximum ratio combiner 63, 73, resulting in the first measuring values 14 and the second measuring values 15, which again are handed on to the noise suppressor 12.

Figure 7:
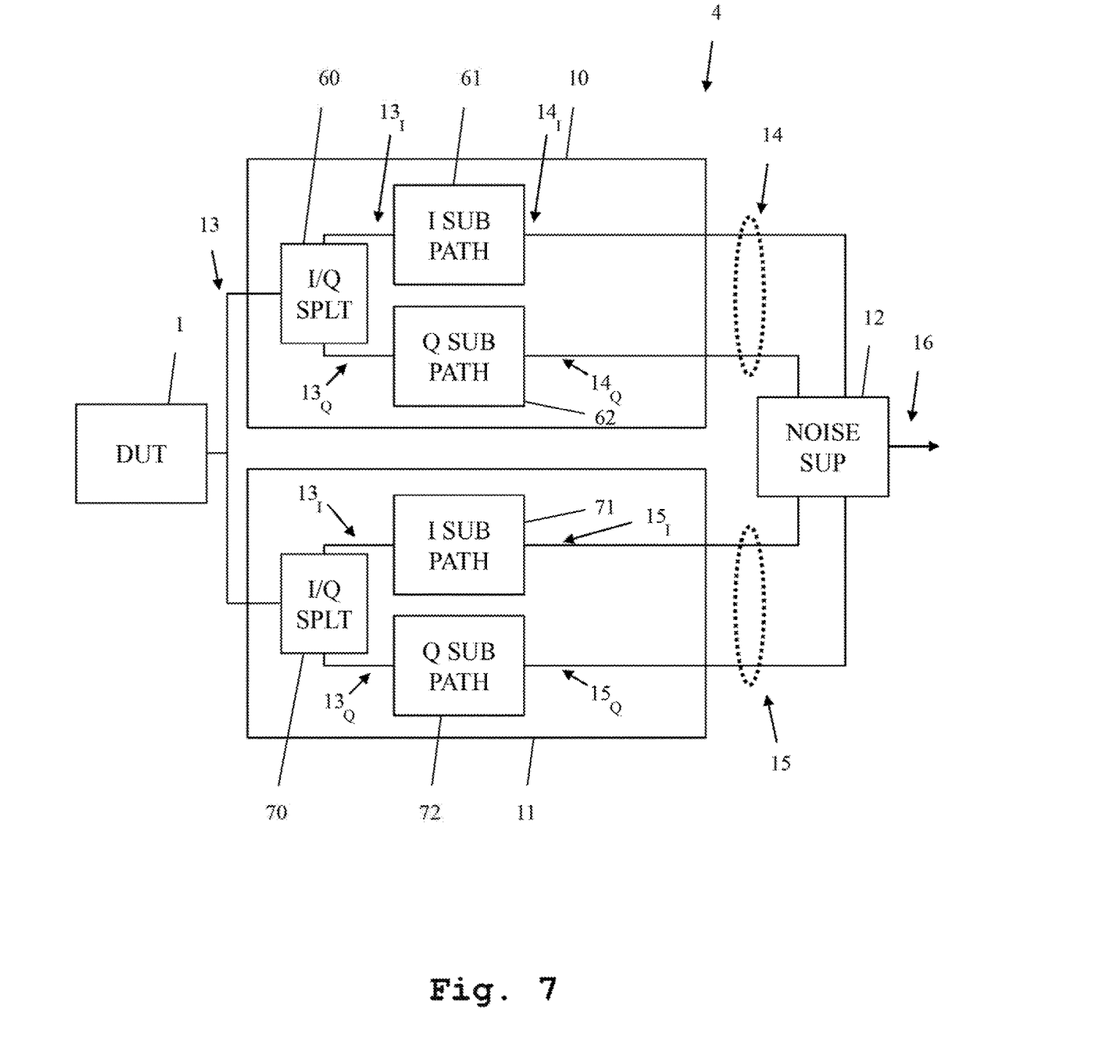
FIG. 7 shows a further example measuring device, in accordance with example embodiments of the present invention.

FIG. 7 shows an alternative embodiment of the measuring device 4 of FIG. 6, without any maximum ratio combiners. In the embodiment of FIG. 7, the in-phase component signal $14_I$, and the quadrature component signal $14_Q$ together form a complex valued first measuring signal 14. Also, the in-phase component signal $15_I$, and the quadrature component signal $15_Q$ together form a complex valued first measuring signal 15. The complex valued first measuring signal 14 and the complex valued second measuring signal 15 are directly fed into the noise suppressor, which then determines the performance value signal 16 therefrom. This may be performed according to the following formula, whereby the absolute value is calculated before the square root is drawn—the formula is thus also defined for values of $Y_1$ and $Y_2$, which comprise an imaginary part and therefore may lead to a negative value under the square root:

$$X_{meas} = \sqrt{\left| \frac{1}{NP_0} \sum_{k=1}^{N} Y_1^{(k)} \cdot \left(Y_2^{(k)}\right)^* \right|} = X_{DUT}$$

Alternatively, the following formula may be used, whereby the real part of the term under the square root is calculated before the square root is drawn:

$$X_{meas} = \sqrt{\Re\left( \frac{1}{NP_0} \sum_{k=1}^{N} Y_1^{(k)} \cdot \left(Y_2^{(k)}\right)^* \right)} = X_{DUT}$$

According to the embodiments of FIGS. 5-7, maximum ratio combiners may be used for combining the signals of sub-paths. These maximum ratio combiners, however, do not have to be in the signal path all the time, and thus may be achieved by a switchable bypass. Such embodiments may be employed, for example, with measuring signals of only a single polarization direction, or signals that do not comprise an in-phase component and an quadrature component. In this case, the embodiments of FIGS. 5-7 work like the embodiments of FIGS. 2 and 3. In these cases, for example, the maximum ratio combiners are bypassed.

Figure 8:
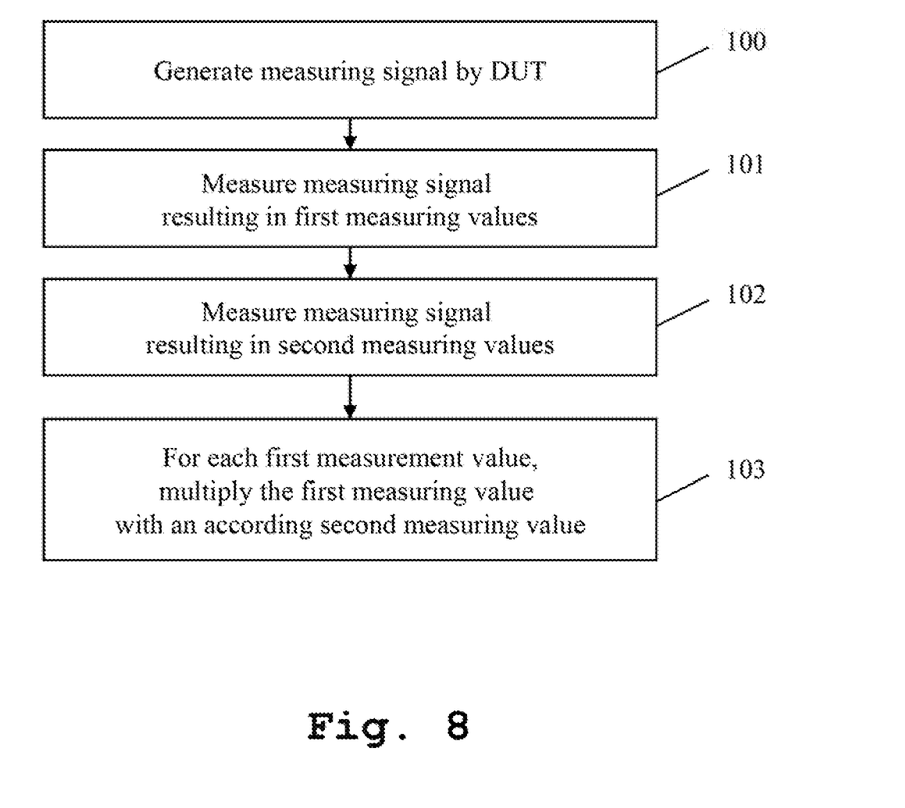
FIG. 8 shows an example measuring method, in accordance with example embodiments of the present invention.

FIG. 8 shows an example measuring method, in accordance with example embodiments of the present invention. In step 100, a measuring signal is generated by a device under test. In step 101, the measuring signal is measured by a first measuring path, resulting in first measuring values. In step 102, the measuring signal is measured by a second measuring path, resulting in second measuring values. The steps 101, 102 may be performed simultaneously. In step 103, for each first measurement value, the first measuring value is multiplied with a respective second measuring value. This allows for effectively removing the channel noise and measuring equipment noise.

The invention is not limited to the examples and especially not to the specific types of performance value signals shown above. The characteristics of the example embodiments can be used in any advantageous combination.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A measuring device for transmitter performance measuring, comprising:
   a first measuring path adapted to receive a measuring signal from a device under test, and to determine first measuring values from the measuring signal;
   a second measuring path adapted to receive the measuring signal, and to determine second measuring values from the measuring signal; and
   a noise suppressor, connected to an output of the first measuring path and to an output of the second measuring path, wherein the noise suppressor is adapted to receive the first measuring values and the second measuring values, and to suppress noise by multiplying each of the first measuring values with a respective one of the second measuring values to generate a respective measuring value product; and
   wherein the noise suppressor is adapted to determine a sum of the measuring value products, generate a normalized sum of products by normalizing the sum of the measuring value products by one or more of a number of the measuring value products and a base power level, and determine a performance value signal of the device under test based on the normalized sum of products.

2. The measuring device according to claim 1, wherein the noise suppressor is adapted to determine a performance value signal of the device under test based on the measuring value products.

3. The measuring device according to claim 2, wherein the performance value signal is one of an error vector magnitude and an in-band emission.

4. The measuring device according to claim 2, further comprising:
   a further fast Fourier transformer adapted to convert the performance signal into the frequency domain.

5. The measuring device according to claim 1, wherein the first measuring path comprises one of a first antenna and a first connector adapted to receive the measuring signal, and the second measuring path comprises one of a second antenna and a second connector adapted to receive the measuring signal.

6. The measuring device according to claim 1, wherein the first measuring path and the second measuring path each comprises a radio frequency corrector adapted to determine and/or correct a carrier frequency error and/or a carrier frequency leakage.

7. The measuring device according to claim 1, wherein the first measuring path and the second measuring path each comprises a fast Fourier transformer adapted to convert the measuring signal, or a signal derived from the measuring signal, into the frequency domain.

8. The measuring device according to claim 7, wherein the first measuring path and the second measuring path each comprises an inverse discrete Fourier transformer adapted to convert a frequency domain signal, derived from the measuring signal, into the time domain.

9. The measuring device according to claim 1, wherein one or more of the first measuring path and the second measuring path comprises an equalizer adapted to perform a signal level equalization of the respective measuring path.

10. A measuring device for transmitter performance measuring, comprising:
    a first measuring path adapted to receive a measuring signal from a device under test, and to determine first measuring values from the measuring signal, wherein the first measuring path comprises one of a first antenna and a first connector adapted to receive the measuring signal;
    a second measuring path adapted to receive the measuring signal, and to determine second measuring values from the measuring signal, wherein the second measuring path comprises one of a second antenna and a second connector adapted to receive the measuring signal;
    a noise suppressor, connected to an output of the first measuring path and to an output of the second measuring path, wherein the noise suppressor is adapted to receive the first measuring values and the second measuring values, and to suppress noise by multiplying each of the first measuring values with a respective one of the second measuring values to generate a respective measuring value product;
    one of a third antenna and a third connector adapted to receive the measuring signal; and
    a splitter adapted to split the measuring signal between the first measuring path and the second measuring path.

11. A measuring device for transmitter performance measuring, comprising:
    a first measuring path adapted to receive a measuring signal from a device under test, and to determine first measuring values from the measuring signal;
    a second measuring path adapted to receive the measuring signal, and to determine second measuring values from the measuring signal; and
    a noise suppressor, connected to an output of the first measuring path and to an output of the second measuring path, wherein the noise suppressor is adapted to receive the first measuring values and the second measuring values, and to suppress noise by multiplying each of the first measuring values with a respective one of the second measuring values to generate a respective measuring value product; and wherein the measuring signal comprises vertically polarized components and horizontally polarized components;

wherein the first measuring path comprises a vertical sub-path adapted to receive the vertically polarized components of the measuring signal and to generate first vertical measuring values therefrom;

wherein the first measuring path comprises a horizontal sub-path adapted to receive the horizontally polarized components of the measuring signal and to generate first horizontal measuring values therefrom;

wherein the second measuring path comprises a vertical sub-path adapted to receive the vertically polarized components of the measuring signal and to generate second vertical measuring values therefrom;

wherein the second measuring path comprises a horizontal sub-path adapted to receive the horizontally polarized components of the measuring signal and to generate second horizontal measuring values therefrom;

wherein the first measuring path comprises a first maximum ratio combiner adapted to generate the first measuring values by combining the first vertical measuring values and the first horizontal measuring values; and wherein the second measuring path comprises a second maximum ratio combiner adapted to generate the second measuring values by combining the second vertical measuring values and the second horizontal measuring values.

12. A measuring device for transmitter performance measuring, comprising:

a first measuring path adapted to receive a measuring signal from a device under test, and to determine first measuring values from the measuring signal;

a second measuring path adapted to receive the measuring signal, and to determine second measuring values from the measuring signal; and a noise suppressor, connected to an output of the first measuring path and to an output of the second measuring path, wherein the noise suppressor is adapted to receive the first measuring values and the second measuring values, and to suppress noise by multiplying each of the first measuring values with a respective one of the second measuring values to generate a respective measuring value product; and wherein the measuring signal comprises vertically polarized components and horizontally polarized components;

wherein the first measuring path is adapted to receive the vertically polarized components of the measuring signal, and to generate first vertical measuring values therefrom, and the second measuring path is adapted to receive the vertically polarized components of the measuring signal, and to generate second vertical measuring values therefrom;

wherein the first measuring path is adapted to receive the horizontally polarized components of the measuring signal, and to generate first horizontal measuring values therefrom, and the second measuring path is adapted to receive the horizontally polarized components of the measuring signal, and to generate second horizontal measuring values therefrom;

wherein the generation of the first and second vertical measuring values by the first and second measuring paths, and the generation of the first and second horizontal measuring values by the first and second measuring paths, are performed in sequential steps; and wherein the measuring device comprises a maximum ratio combiner adapted to generate the first measuring signal by combining the first horizontal measuring values with the first vertical measuring values, and to generate the second measuring signal by combining the second horizontal measuring values with the second vertical measuring values.

13. A measuring device for transmitter performance measuring, comprising:

a first measuring path adapted to receive a measuring signal from a device under test, and to determine first measuring values from the measuring signal;

a second measuring path adapted to receive the measuring signal, and to determine second measuring values from the measuring signal; and a noise suppressor, connected to an output of the first measuring path and to an output of the second measuring path, wherein the noise suppressor is adapted to receive the first measuring values and the second measuring values, and to suppress noise by multiplying each of the first measuring values with a respective one of the second measuring values to generate a respective measuring value product; and wherein the first measuring path comprises a first in-phase sub-path adapted to receive an in-phase component of the measuring signal and to determine first in-phase measuring values therefrom;

wherein the first measuring path comprises a first quadrature sub-path adapted to receive a quadrature component of the measuring signal and to determine first quadrature measuring values therefrom;

wherein the second measuring path comprises a second in-phase sub-path adapted to receive the in-phase component of the measuring signal and to determine second in-phase measuring values therefrom;

wherein the second measuring path comprises a second quadrature sub-path adapted to receive the quadrature component of the measuring signal and to determine second quadrature measuring values therefrom;

wherein the measuring device comprises a first maximum ratio combiner adapted to generate the first measuring signal by combining the first in-phase measuring values with the first quadrature measuring values; and wherein the measuring device comprises a second maximum ratio combiner adapted to generate the second measuring signal by combining the second in-phase measuring values with the second quadrature measuring values.

14. A measuring method for transmitter performance measuring, comprising:

receiving, by a measuring device via a first measuring path, a measuring signal from a device under test, and determining first measuring values based on the measuring signal;

receiving, by the measuring device via a second measuring path, the measuring signal, and determining second measuring values based on the measuring signal;

suppressing noise, by a noise suppressor of the measuring device, by multiplying each of the first measuring values with a respective one of the second measuring values to generate a respective measuring value product;

determining a sum of the measuring value products;

generating a normalized sum of products by normalizing the sum of the measuring value products by one or more of a number of the measuring value products and a base power level; and determining a performance value signal of the device under test based on the normalized sum of products.

* * * * *